(12) United States Patent
Park et al.

(10) Patent No.: US 9,136,059 B2
(45) Date of Patent: Sep. 15, 2015

(54) MULTILAYER CERAMIC CAPACITOR AND BOARD FOR MOUNTING THE SAME

(71) Applicant: SAMSUNG ELECTRO-MECHANICS CO., LTD., Suwon, Gyunggi-do (KR)

(72) Inventors: Min Cheol Park, Suwon (KR); Heung Kil Park, Suwon (KR)

(73) Assignee: SAMSUNG ELECTRO-MECHANICS CO., LTD., Suwon-Si, Gyeonggi-Do (KR)

(*) Notice: Subject to any disclaimer, the term of this patent is extended or adjusted under 35 U.S.C. 154(b) by 78 days.

(21) Appl. No.: 14/047,930

(22) Filed: Oct. 7, 2013

(65) Prior Publication Data

US 2015/0014033 A1    Jan. 15, 2015

(30) Foreign Application Priority Data

Jul. 11, 2013  (KR) .......................... 10-2013-0081443

(51) Int. Cl.
*H05K 1/16* (2006.01)
*H01G 4/30* (2006.01)
(Continued)

(52) U.S. Cl.
CPC .............. *H01G 4/30* (2013.01); *H05K 1/0243* (2013.01); *H05K 3/3442* (2013.01); *H05K 2201/10015* (2013.01)

(58) Field of Classification Search
CPC ......... H05K 1/18; H05K 1/0231; H01G 4/30; H01G 4/005; H01G 4/012; H01G 4/228; H01G 2/232
USPC .......... 174/269; 361/301.4, 303, 306.3, 321.3
See application file for complete search history.

(56) References Cited

U.S. PATENT DOCUMENTS 7,567,425 B1 * 7/2009 Lee et al. .................... 361/306.3
7,646,585 B2 * 1/2010 Aoki .......................... 361/306.1
(Continued)

FOREIGN PATENT DOCUMENTS

JP    3-060148 A     3/1991
JP    5-347527 A    12/1993
(Continued)

OTHER PUBLICATIONS

Korean Office Action issued in corresponding Korean Application No. 10-2013-0081443, dated Jul. 4, 2014, with English translation.
(Continued)

*Primary Examiner* — Xiaoliang Chen
(74) *Attorney, Agent, or Firm* — McDermott Will & Emery LLP

(57) ABSTRACT

There is provided a multilayer ceramic capacitor includes a ceramic body including dielectric layers and having first and second main surfaces facing each other, first and second side surfaces facing each other, and first and second end surfaces facing each other; a capacitor part formed in the ceramic body and including a first internal electrode having a lead exposed to the first side surface and a second internal electrode exposed to the second end surface; first to third internal connecting conductors formed in the ceramic body and having at least one polarity; and first to fourth external electrodes electrically connected to the first and second internal electrodes and the first to third internal connecting conductors, wherein the first and second internal connecting conductors and the third internal connecting conductor are connected in parallel, and the first to third internal connecting conductors and the capacitor part are connected in series.

9 Claims, 7 Drawing Sheets

(51) Int. Cl.
*H05K 1/02* (2006.01)
*H05K 3/34* (2006.01)

(56) References Cited

U.S. PATENT DOCUMENTS

| | | |
|---|---|---|
| 2009/0086403 A1* | 4/2009 | Lee et al. ............... 361/301.4 |
| 2009/0128985 A1* | 5/2009 | Aoki ...................... 361/301.4 |
| 2009/0139757 A1 | 6/2009 | Lee et al. |
| 2009/0231779 A1* | 9/2009 | Aoki ...................... 361/301.4 |
| 2012/0162853 A1 | 6/2012 | Togashi |
| 2014/0311788 A1 | 10/2014 | Park et al. |

FOREIGN PATENT DOCUMENTS

| | | |
|---|---|---|
| JP | 2004-273701 A | 9/2004 |
| JP | 2006-237234 A | 9/2006 |
| JP | 2012-138415 A | 7/2012 |
| JP | 2014-216639 A | 11/2014 |
| KR | 10-0916476 B1 | 9/2009 |
| KR | 10-0925603 B1 | 11/2009 |

OTHER PUBLICATIONS

Japanese Office Action dated Apr. 14, 2015 issued in Japanese Patent Application No. 2013-211728 (English . translation thereof).

* cited by examiner

MULTILAYER CERAMIC CAPACITOR AND BOARD FOR MOUNTING THE SAME

CROSS-REFERENCE TO RELATED APPLICATION

This application claims the priority of Korean Patent Application No. 10-2013-0081443 filed on Jul. 11, 2013, with the Korean Intellectual Property Office, the disclosure of which is incorporated herein by reference.

BACKGROUND OF THE INVENTION

1. Field of the Invention

The present invention relates to a multilayer ceramic capacitor and a board for mounting the same.

2. Description of the Related Art

A multilayer ceramic capacitor (MLCC), one of multilayer chip electronic components, is a chip-type condenser mounted on printed circuit boards of various electronic products including display devices such as liquid crystal displays (LCDs), plasma display panels (PDPs), or the like, computers, smartphones, and cellular phones, and the like, to charge or discharge electricity.

The multilayer ceramic capacitor may be used as components of various electronic devices due to advantages thereof such as a small size, high capacitance, easiness of mounting, and the like.

The multilayer ceramic capacitor may have a structure in which a plurality of dielectric layers and internal electrodes having opposite polarities and interposed between the dielectric layers are alternately laminated.

In particular, a power supply device for a central processing unit (CPU) of a computer, or the like, has a problem in that voltage noise may be generated due to a rapid change in load current during a process of providing low voltage.

In addition, as importance of power supply device efficiency has increased in recent years, a rapid switching speed is required for decreasing a loss in efficiency.

However, in the case in which the switching speed increases, a negative offset phenomenon such as an increase in electromagnetic interference (EMI) may occur.

In addition, in the case in which field effect transistors (FET) configuring a direct current (DC)/direct current (DC) converter are switched, a ringing phenomenon may occur due to inductance of wirings and parasitic capacitance of the FETs to hinder peripheral circuits while emitting high frequency noise.

That is, resonance may be generated by the inductance of the wirings and the capacitance of switching devices such as the FETs, or the like, and electromagnetic interference may occur due to the high frequency noise.

In particular, since a power supply circuit and analogue circuits such as a wireless circuit, a voice circuit, or the like, are adjacent to each other in a small portable terminal such as a smartphone, a tablet PC, or the like, communications errors or sound quality deterioration may occur.

In general, research into a technology of adding a C-R snubber to the FET in order to overcome the above-described problems has been conducted. However, in the method of adding the C-R snubber to the FET, power is partially consumed in the C-R snubber at the time of switching, conversion efficiency of the DC/DC converter is deteriorated.

Therefore, research into a technology of suppressing the ringing phenomenon while preventing deterioration in the conversion efficiency of the DC/DC converter to decrease the noise is still required.

RELATED ART DOCUMENT (Patent Document 1) Japanese Patent Laid-Open Publication No. 2012-138415

SUMMARY OF THE INVENTION

An aspect of the present invention provides a multilayer ceramic capacitor and a board for mounting the same.

According to an aspect of the present invention, there is provided a multilayer ceramic capacitor including: a ceramic body including a plurality of dielectric layers and having first and second main surfaces facing each other, first and second side surfaces facing each other, and first and second end surfaces facing each other; a capacitor part formed in the ceramic body and including a first internal electrode having a lead exposed to the first side surface and a second internal electrode exposed to the second end surface; first to third internal connecting conductors formed in the ceramic body and having at least one polarity; and first to fourth external electrodes formed outwardly of the ceramic body and electrically connected to the first and second internal electrodes and the first to third internal connecting conductors, wherein the first and second internal connecting conductors and the third internal connecting conductor are connected in parallel, and the first to third internal connecting conductors and the capacitor part are connected in series.

The first and second external electrodes may be disposed on the first and second end surfaces facing each other of the ceramic body, respectively, and the third and fourth external electrodes may be disposed on the first and second side surfaces facing each other of the ceramic body, respectively.

The first and second internal connecting conductors may contain a non-magnetic material.

The first internal connecting conductor may be exposed to the first end surface and the second side surface.

The second internal connecting conductor may be exposed to the first and second side surfaces.

The third internal connecting conductor may be exposed to the first end surface and the first side surface.

An equivalent serial resistance (ESR) of the multilayer ceramic capacitor may be controlled by the first to third internal connecting conductors.

An equivalent serial resistance (ESR) of the multilayer ceramic capacitor may be increased in a high frequency band as compared to a low frequency band.

According to another aspect of the present invention, there is provided a multilayer ceramic capacitor including: a ceramic body including a plurality of dielectric layers and having first and second main surfaces facing each other, first and second side surfaces facing each other, and first and second end surfaces facing each other; a capacitor part formed in the ceramic body and including a first internal electrode having a lead exposed to the second side surface and a second internal electrode exposed to the second end surface; first to third internal connecting conductors formed in the ceramic body and having at least one polarity; and first to fourth external electrodes formed outwardly of the ceramic body and electrically connected to the first and second internal electrodes and the first to third internal connecting conductors, wherein the first internal connecting conductor and the second and third internal connecting conductors are connected in parallel, and the first to third internal connecting conductors and the capacitor part are connected in series.

The first and second external electrodes may be disposed on the first and second end surfaces facing each other of the ceramic body, respectively, and the third and fourth external electrodes may be disposed on the first and second side surfaces facing each other of the ceramic body, respectively.

The first internal connecting conductor may contain a non-magnetic material.

The first internal connecting conductor may be exposed to the first end surface and the second side surface.

The second internal connecting conductor may be exposed to the first end surface and the first side surface.

The third internal connecting conductor may be exposed to the first and second side surfaces.

An equivalent serial resistance (ESR) of the multilayer ceramic capacitor may be controlled by the first to third internal connecting conductors.

An equivalent serial resistance (ESR) of the multilayer ceramic capacitor may be increased in a high frequency band as compared to a low frequency band.

According to another aspect of the present invention, there is provided a board for mounting a multilayer ceramic capacitor, the board including: a printed circuit board having first and second electrode pads disposed thereon; and the multilayer ceramic capacitor as described above mounted on the printed circuit board.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Figure 1:
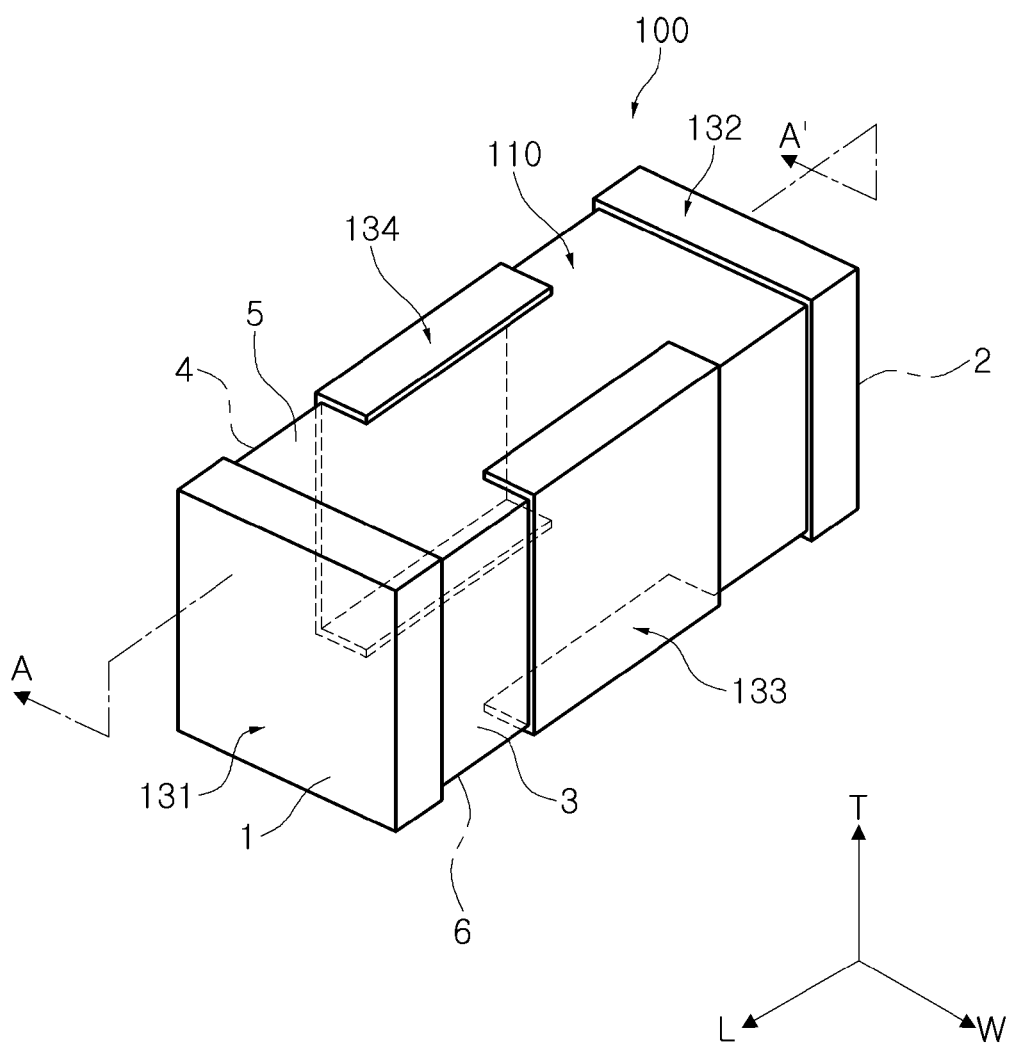
FIG. 1 is a perspective view of a multilayer ceramic capacitor according to an embodiment of the present invention.

Embodiments of the present invention will now be described in detail with reference to the accompanying drawings.

The invention may, however, be embodied in many different forms and should not be construed as being limited to the embodiments set forth herein.

Rather, these embodiments are provided so that this disclosure will be thorough and complete, and will fully convey the scope of the invention to those skilled in the art.

In the drawings, the shapes and dimensions of elements may be exaggerated for clarity, and the same reference numerals will be used throughout to designate the same or like elements.

Directions of a hexahedron will be defined in order to clearly describe embodiments of the invention. L, W and T shown in the drawings refer to a length direction, a width direction, and a thickness direction, respectively. Here, a thickness direction may be used to have the same meaning as a direction in which dielectric layers are laminated.

Multilayer Ceramic Capacitor

Hereinafter, exemplary embodiments of the present invention will now be described in detail with reference to the accompanying drawings.

FIG. 1 is a perspective view of a multilayer ceramic capacitor according to an embodiment of the present invention.

Figure 2:
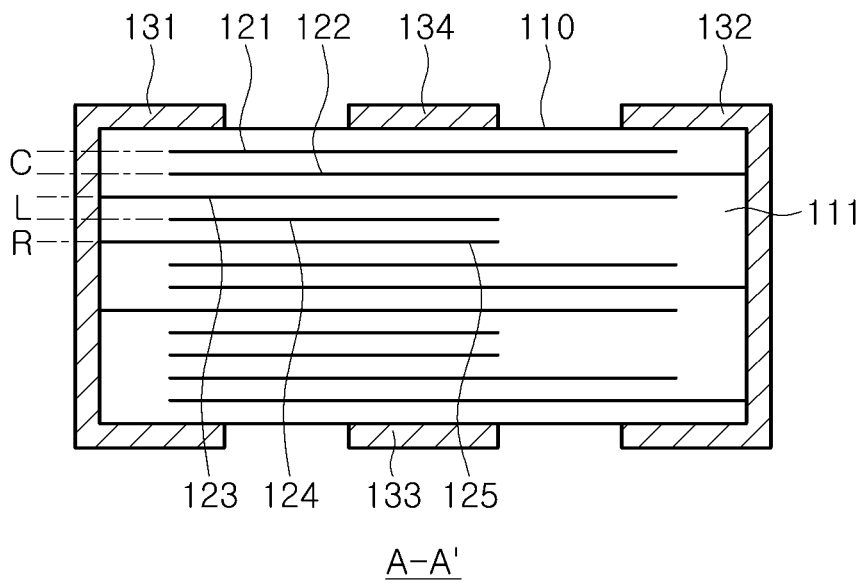
FIG. 2 is a cross-sectional view taken along line A-A' of FIG. 1.

FIG. 2 is a cross-sectional view taken along line A-A' of FIG. 1.

Referring to FIGS. 1 and 2, a multilayer ceramic capacitor 100 according to the embodiment of the invention may include a ceramic body 110 including a plurality of dielectric layers 111 and having first and second main surfaces 5 and 6 facing each other in a thickness direction thereof, first and second side surfaces 3 and 4 facing each other in a width direction thereof, and first and second end surfaces 1 and 2 facing each other in a length direction thereof.

In the present embodiment, the ceramic body 110 may have the first main surface 5 and the second main surface 6 facing each other, and the first and second side surfaces 3 and 4 and the first and second end surfaces 1 and 2 connecting the first main surface and the second main surface.

The ceramic body 110 may have a hexahedral shape as shown in the drawings, but the shape thereof is not specifically limited thereto.

The ceramic body 110 may be formed by laminating the plurality of dielectric layers 111, and the plurality of first and second internal electrodes 121 and 122 may be disposed in the ceramic body 110 so as to be spaced apart from each other, having the dielectric layer 111 interposed therebetween.

The plurality of dielectric layers 111 configuring the ceramic body 110 are in a sintered state and may be integrated with each other such that boundaries therebetween may not be readily apparent.

The dielectric layer 111 may be formed by sintering a ceramic green sheet containing a ceramic powder, an organic solvent, and an organic binder. As the ceramic powder, which is a material having high permittivity, a barium titanate (BaTiO$_3$)-based material, a strontium titanate (SrTiO$_3$)-based material, or the like, may be used. However, the ceramic powder is not limited thereto.

The multilayer ceramic capacitor 100 may include a capacitor part C formed in the ceramic body 110 and including the first internal electrode 121 having a lead 121a exposed to the first side surface 3 and the second internal electrode 122 exposed to the second end surface 2.

In addition, the multilayer ceramic capacitor 100 may include the first to third internal connecting conductors 123, 124, and 125 having at least one polarity, formed in the ceramic body 110.

The first and second internal connecting conductors 123 and 124 among the first to third internal connecting conductors 123, 124, and 125 may form a single turn inductor L in the multilayer ceramic capacitor 100.

The inductor L formed by the first and second internal connecting conductors 123 and 124 may obtain an inductance of 1 to 5 nH, but is not limited thereto.

In addition, the third internal connecting conductor 125 among the first to third internal connecting conductors 123, 124, and 125 may form a resistor R in the multilayer ceramic capacitor 100.

The resistor R formed by the third internal connecting conductor 125 may be controlled to have various resistance values according to dimension, area, or the number of layers of the third internal connecting conductor 125.

The resistor R may have resistance values of 0.1 to 1.0Ω, but is not limited thereto.

As described above, an effective frequency may be controlled by the inductance of the inductor formed by the first and second internal connecting conductors 123 and 124 and the resistance value of the resistor formed by the third internal connecting conductor 125, and a ringing phenomenon may be suppressed by equivalent serial resistance (ESR) increasing in a high frequency band, so that noise may be decreased.

The first and second internal electrodes 121 and 122 included in the multilayer ceramic capacitor 100 according to the present embodiment may be formed by a conductive paste containing a conductive metal.

The conductive metal may be nickel (Ni), copper (Cu), palladium (Pd), or alloys thereof, but is not limited thereto.

Internal electrodes may be printed on ceramic green sheets configuring the dielectric layers using the conductive paste through a printing method such as a screen printing method or a gravure printing method.

The ceramic green sheets having the internal electrodes printed thereon may be alternately stacked and sintered to thereby form the ceramic body.

Meanwhile, materials for the first and second internal connecting conductors 123 and 124 are not specifically limited as long as they can form the inductor L. For example, the first and second internal connecting conductors 123 and 124 may contain a non-magnetic material.

The non-magnetic material may be a ferrite containing zinc (Zn), copper (Cu), titanium (Ti), or alloys thereof, but is not limited thereto.

A material for the third internal connecting conductor 125 is not specifically limited as long as it can form the resistor (R). For example, the third internal connecting conductor 125 may be formed by a conductive paste containing a conductive metal, like the first and second internal electrodes 121 and 122.

The conductive metal may be nickel (Ni), copper (Cu), palladium (Pd), or alloys thereof, but is not limited thereto.

In addition, the multilayer ceramic capacitor 100 may include first to fourth external electrodes 131, 132, 133 and 134 formed outwardly of the ceramic body 110 and electrically connected to the first and second internal electrodes 121 and 122 and the first to third internal connecting conductors 123, 124, and 125.

The first and second external electrodes 131 and 132 may be disposed on the first and second end surfaces 1 and 2 of the ceramic body 110 facing each other, and the third and fourth external electrodes 133 and 134 may be disposed on the first and second side surfaces 3 and 4 of the ceramic body 110 facing each other.

According to the present embodiment, it may be appreciated that two external electrodes 133 and 134, other than the first and second external electrodes 131 and 132 used as external terminals for making connections with a power line, are used for controlling the ESR.

Meanwhile, the first and second external electrodes used as the external terminals may be arbitrarily selected to meet desired ESR properties, and therefore, are not specifically limited.

The first to fourth external electrodes 131, 132, 133, and 134 may be formed by a conductive paste containing a conductive metal.

The conductive metal may be nickel (Ni), copper (Cu), tin (Sn), or alloys thereof, but is not limited thereto.

The conductive paste may further contain an insulating material. Here, the insulating material may be glass, but is not limited thereto.

A method of forming the first to fourth external electrodes 131, 132, 133, and 134 is not specifically limited, and the first to fourth external electrodes 131, 132, 133, and 134 may be formed by dipping the ceramic body or by using other methods such as a plating method, and the like.

The multilayer ceramic capacitor 100 is a four-terminal capacitor having four external electrodes, but the invention is not limited thereto.

Figure 3:
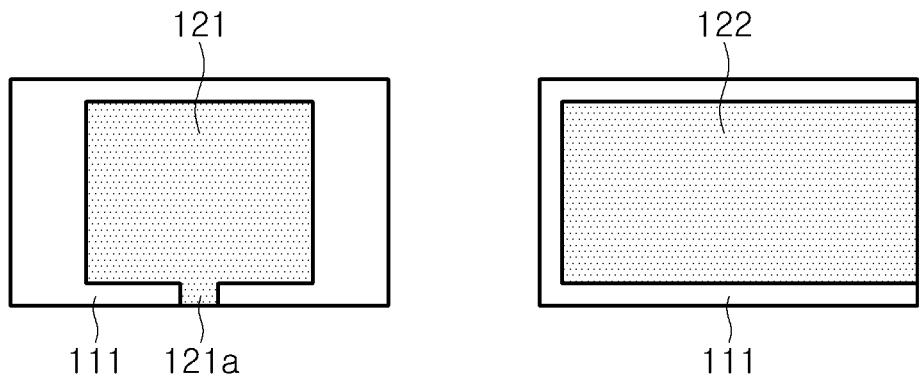
FIG. 3 is a plan view showing first and second internal electrodes usable in the multilayer ceramic capacitor of FIG. 1.

FIG. 3 is a plan view showing the first and second internal electrodes usable in the multilayer ceramic capacitor of FIG. 1.

Figure 4:
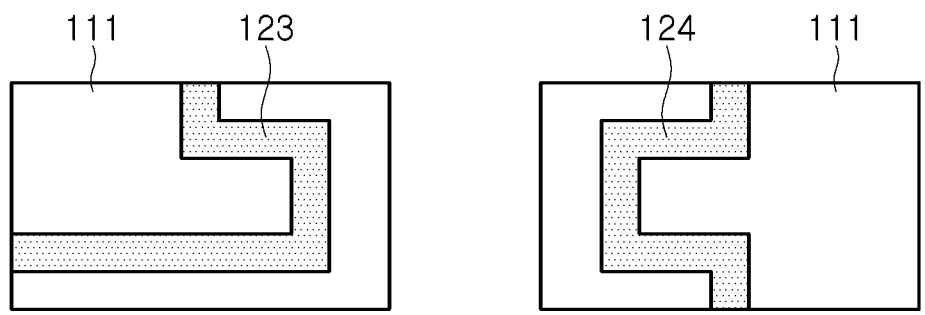
FIG. 4 is a plan view showing first and second internal connecting conductors usable with the first and second internal electrodes of FIG. 3.

FIG. 4 is a plan view showing the first and second internal connecting conductors usable with the first and second internal electrodes of FIG. 3.

Figure 5:
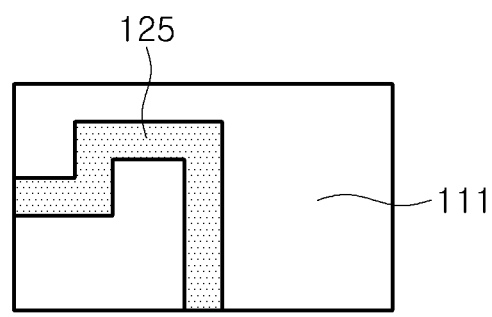
FIG. 5 is a plan view showing a third internal connecting conductor usable with the first and second internal electrodes of FIG. 3.

FIG. 5 is a plan view showing the third internal connecting conductor usable with the first and second internal electrodes of FIG. 3.

Hereinafter, the first and second internal electrodes 121 and 122, the first to third internal connecting conductors 123, 124, and 125, and the external electrodes 131, 132, 133, and 134 in the multilayer ceramic capacitor 100 according to the embodiment of the invention will be described in detail with reference to FIGS. 2 through 5.

Referring to FIGS. 2 and 3, the capacitor part C may be formed in the ceramic body 110, and include the first internal electrode 121 having the lead 121a exposed to the first side surface 3 and the second internal electrode 122 exposed to the second end surface 2 to form capacitance.

The capacitor part C may be disposed in the ceramic body 110 without being specifically limited, and the plurality of capacitor parts may be stacked in order to implement a target capacitance.

The first and second internal electrodes 121 and 122, along with the first to third internal connecting conductors 123, 124, and 125, may be alternately disposed, having the dielectric layer 111 interposed therebetween.

FIG. 3 illustrates the first and second internal electrodes 121 and 122 in a singular manner; however, pluralities thereof may be employed in the embodiment.

FIGS. 4 and 5 illustrate the first to third internal connecting conductors 123, 124, and 125 in a singular manner; however, pluralities thereof having at least one polarity may be employed in the embodiment.

Meanwhile, the internal electrodes and the internal connecting conductors may be stacked in order of those illustrated in FIGS. 3, 4, and 5, but may be stacked in various orders, as needed.

For example, as shown in FIG. 2, the first to third internal connecting conductors 123, 124, and 125 may be positioned between the capacitor part C.

In the embodiment of the invention, the first internal connecting conductor 123 may be exposed to the first end surface and the second side surface, but the invention is not limited thereto.

In addition, in the embodiment of the invention, the second internal connecting conductor 124 may be exposed to the first and second side surfaces, but the invention is not limited thereto.

Further, in the embodiment of the invention, the third internal connecting conductor 125 may be exposed to the first end surface and the first side surface, but the invention is not limited thereto.

In the embodiment of the invention, the first internal connecting conductor 123 may be exposed to the first end surface 1 and the second side surface 4, and may be connected to the second internal connecting conductor 124 through the fourth external electrode 134, but the invention is not limited thereto.

In the embodiment of the invention, the first and second internal connecting conductors 123 and 124 may be connected in parallel to the third internal connecting conductor 125.

In the embodiment of the invention, the first and second internal connecting conductors 123 and 124 may form the inductor L, one end of the first internal connecting conductor 123 may be connected to the first external electrode 131, and one end of the second internal connecting conductor 124 may be connected to the first internal electrode 121 through the third external electrode 133.

In addition, one end of the third internal connecting conductor 125 may be connected to the first external electrode 131 and the other end thereof may be connected to the first internal electrode 121 through the third external electrode 133.

A pattern of the first to third internal connecting conductors 123, 124, and 125 shown in FIGS. 4 and 5 is merely exemplary according to the embodiment of the invention, and therefore, the first to third internal connecting conductors may have various patterns in order to control the ESR.

For example, the pattern of the first to third internal connecting conductors may be the same as that of the first and second internal electrodes 121 and 122 shown in FIG. 3.

According to the embodiment of the invention, the ESR of the multilayer ceramic capacitor may be controlled by the first to third internal connecting conductors 123, 124, and 125.

That is, the first and second internal connecting conductors 123 and 124 and the third internal connecting conductor 125 may be connected in parallel, and the first to third internal connecting conductors 123, 124, and 125 and the capacitor part C may be connected in series to be described below.

Due to the above-described connections, the ESR of the multilayer ceramic capacitor may be controlled by the first to third internal connecting conductors 123, 124, and 125.

According to the embodiment of the invention, the ESR of the multilayer ceramic capacitor may be increased in a high frequency band as compared to a low frequency band.

Therefore, since the ESR is decreased in the low frequency band, the ringing phenomenon may be suppressed by the ESR increasing in the high frequency band without consuming switching current required for converting the power of a direct current (DC) to direct current (DC) converter, so that noise may be decreased.

In addition, the multilayer ceramic capacitor according to the embodiment of the invention may include the capacitor part C and the first to third internal connecting conductors 123, 124, and 125 forming the inductor L and the resistor R, such that resonance may be suppressed without affecting conversion efficiency of the DC-DC converter, whereby noise may be decreased.

Further, in the present embodiment, the first and second external electrodes 131 and 132 may be used as external terminals for connecting the power line. For example, the first external electrode 131 may be connected to a power supply terminal, and the second external electrode 132 may be connected to a ground.

Meanwhile, the third and fourth external electrodes 133 and 134 other than the first and second external electrodes 131 and 132 may be used as external electrodes for controlling the ESR, and may be non-contact terminals.

Figure 6:
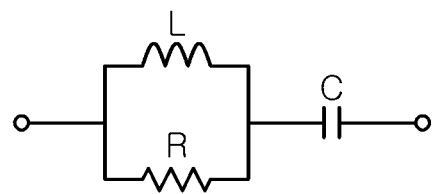
FIG. 6 is an equivalent circuit diagram of the multilayer ceramic capacitor of FIG. 1.

FIG. 6 is an equivalent circuit diagram of the multilayer ceramic capacitor of FIG. 1.

Referring to FIG. 6, the first and second internal connecting conductors 123 and 124 forming the inductor L and the third internal connecting conductor 125 forming the resistor R may be connected in parallel, and the first to third internal connecting conductors 123, 124, and 125 forming the inductor L and the resistor R and the capacitor part C may be connected in series.

As described above, the multilayer ceramic capacitor according to the embodiment of the invention may have a single capacitor part C, a single inductor L, and a single resistor R, and may control respective values thereof.

The multilayer ceramic capacitor according to the embodiment of the invention may include the internal electrodes 121 and 122, the internal connecting conductors 123, 124, and 125, and the external electrodes 131, 132, 133, and 134, having the above-described structures, so that the multilayer ceramic capacitor for the DC-DC converter capable of suppressing the resonance may be realized.

In addition, in the multilayer ceramic capacitor according to the embodiment of the invention, the ESR thereof is decreased in the low frequency band and the ESR thereof is increased in the high frequency band, such that the ringing phenomenon may be suppressed by the ESR increased in the high frequency band without consuming the switching current required for converting the power of the DC-DC converter.

Figure 7:
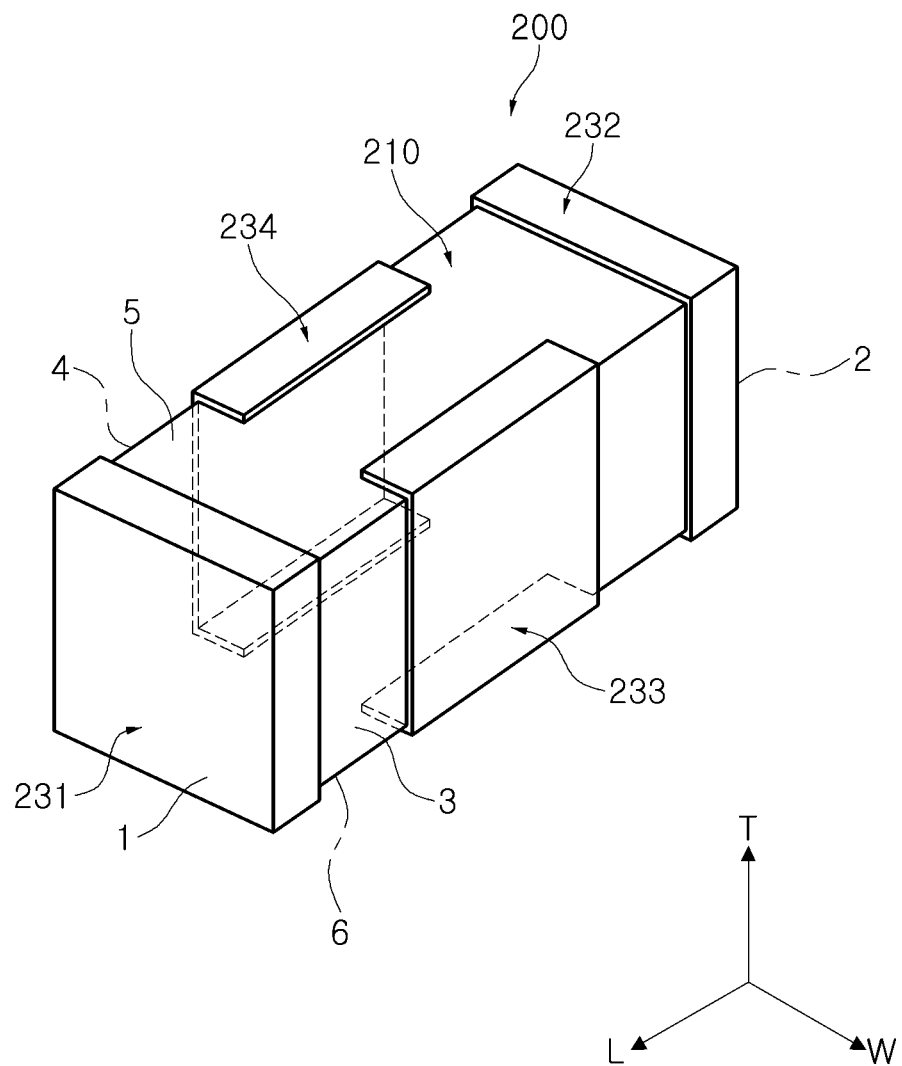
FIG. 7 is a perspective view of a multilayer ceramic capacitor according to another embodiment of the present invention.

FIG. 7 is a perspective view of a multilayer ceramic capacitor according to another embodiment of the invention.

Figure 8:
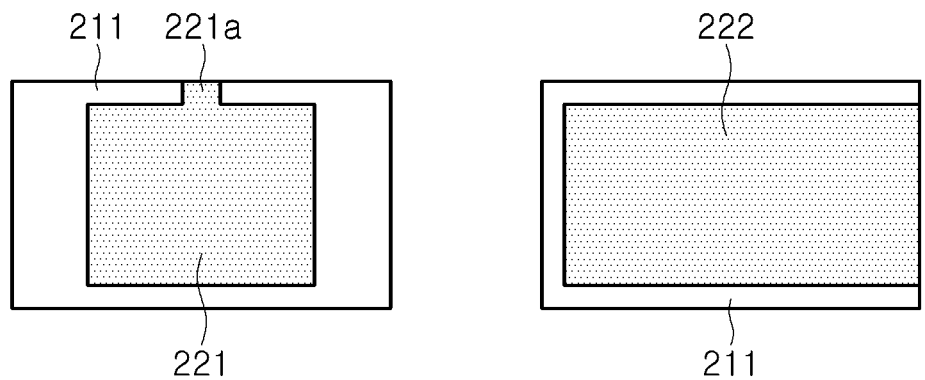
FIG. 8 is a plan view showing first and second internal electrodes usable in the multilayer ceramic capacitor of FIG. 7.

FIG. 8 is a plan view showing first and second internal electrodes usable in the multilayer ceramic capacitor of FIG. 7.

Figure 9:
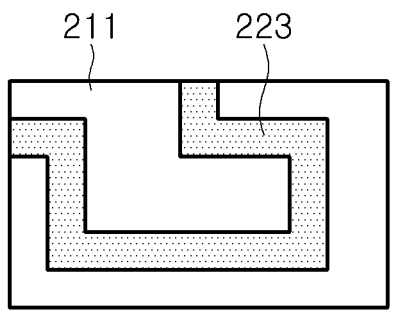
FIG. 9 is a plan view showing a first internal connecting conductor usable with the first and second internal electrodes of FIG. 8.

FIG. 9 is a plan view showing a first internal connecting conductor usable with the first and second internal electrodes of FIG. 8.

Figure 10:
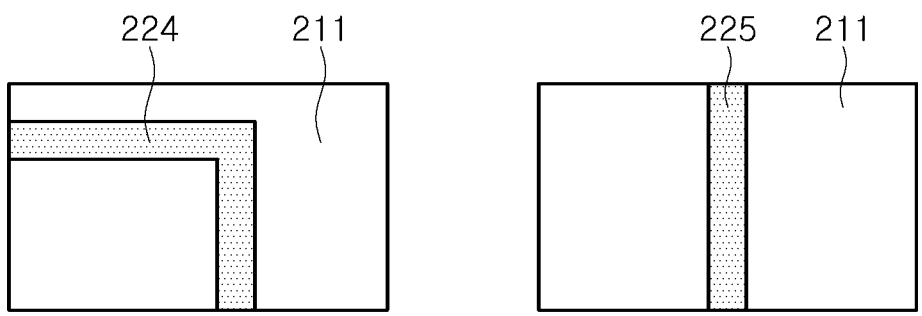
FIG. 10 is a plan view showing second and third internal connecting conductors usable with the first and second internal electrodes of FIG. 8.

FIG. 10 is a plan view showing second and third internal connecting conductors usable with the first and second internal electrodes of FIG. 8.

Referring to FIGS. 7 to 10, a multilayer ceramic capacitor 200 according to another embodiment of the invention may include: a ceramic body 210 including a plurality of dielectric layers 211 and having first and second main surfaces facing each other in a thickness direction thereof, first and second side surfaces facing each other in a width direction thereof, and first and second end surfaces facing each other in a length direction thereof; a capacitor part formed in the ceramic body 210 and including a first internal electrode 221 having a lead 221a exposed to the second side surface and a second internal electrode 222 exposed to the second end surface; first to third internal connecting conductors 223, 224, and 225 formed in the ceramic body 210 and having at least one polarity; and first to fourth external electrodes 231, 232, 233, and 234 formed outwardly of the ceramic body 210 and electrically connected to the first and second internal electrodes 221 and 222 and the first to third internal connecting conductors 223, 224, and 225, wherein the first internal connecting conductor 223 and the second and third internal connecting conductors 224 and 225 are connected in parallel, and the first to third internal connecting conductors 223, 224, and 225 and the capacitor part are connected in series.

A description of the same features of the multilayer ceramic electronic component according to another embodiment of the invention as compared to those of the multilayer ceramic electronic component according to the above-described embodiment of the invention will be omitted.

The first and second external electrodes 231 and 232 may be disposed on the first and second end surfaces 1 and 2 facing each other of the ceramic body, respectively, and the third and fourth external electrodes 233 and 234 may be disposed on the first and second side surfaces 3 and 4 facing each other of the ceramic body 210, respectively.

The first internal connecting conductor 223 may contain a non-magnetic material.

The first internal connecting conductor 223 may be exposed to the first end surface 1 and the second side surface 4.

The second internal connecting conductor 224 may be exposed to the first end surface 1 and the first side surface 3.

The third internal connecting conductor 225 may be exposed to the first side surface 3 and the second side surface 4.

According to the embodiment of the invention, the ESR of the multilayer ceramic capacitor may be controlled by the first to third internal connecting conductors 223, 224, and 225.

The ESR of the multilayer ceramic capacitor may be increased in the high frequency band as compared to the low frequency band.

Board for Mounting Multilayer Ceramic Capacitor

Figure 11:
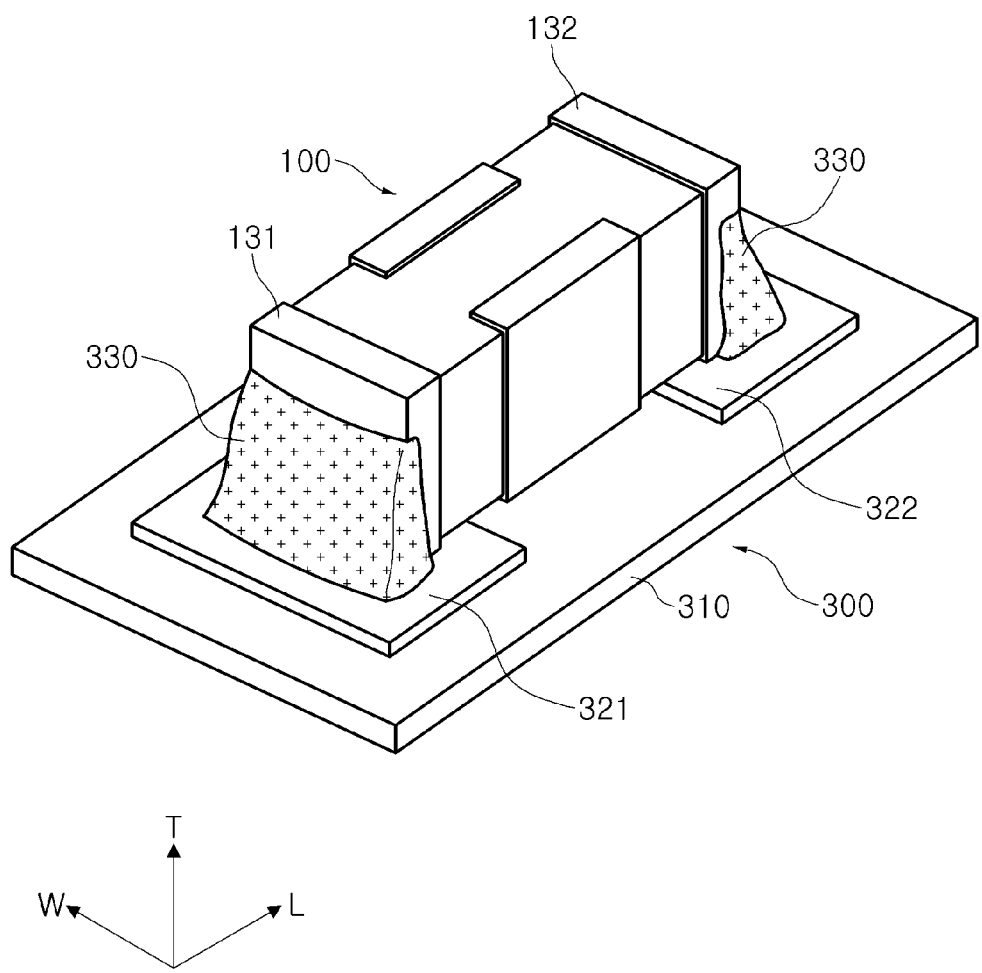
FIG. 11 is a perspective view showing a state in which the multilayer ceramic capacitor of FIG. 1 is mounted on a printed circuit board.

FIG. 11 is a perspective view showing a state in which the multilayer ceramic capacitor of FIG. 1 is mounted on a printed circuit board.

Figure 12:
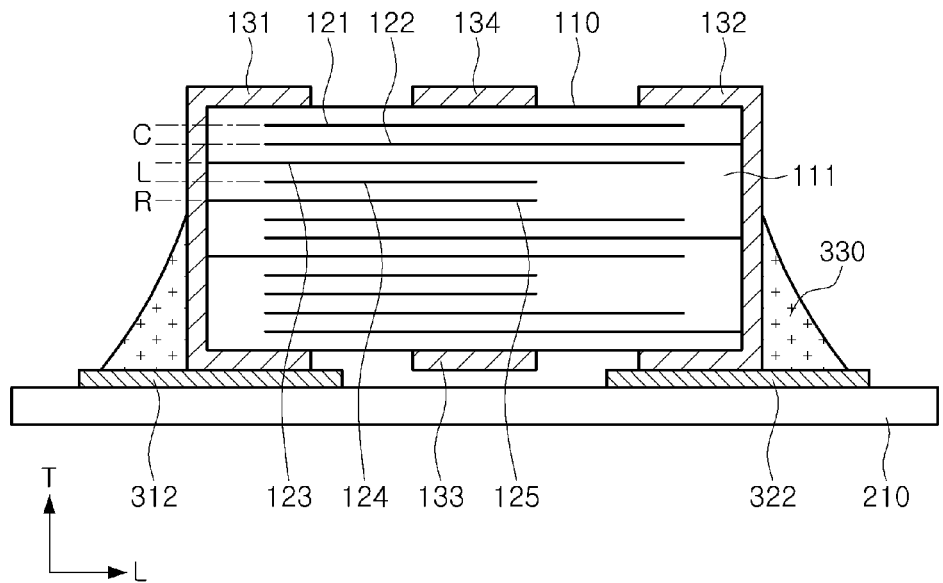
FIG. 12 is a cross-sectional view of the multilayer ceramic capacitor and the printed circuit board of FIG. 11 taken in a length direction.

FIG. 12 is a cross-sectional view of the multilayer ceramic capacitor and the printed circuit board of FIG. 11, taken in a length direction.

Referring to FIGS. 11 and 12, a board 300 for mounting the multilayer ceramic capacitor 100 according to the present embodiment may include a printed circuit board 310 having the multilayer ceramic capacitor 100 horizontally mounted thereon, and first and second electrode pads 321 and 322 formed on the printed circuit board 310 so as to be spaced apart from each other.

Here, the multilayer ceramic capacitor 100 may be electrically connected to the printed circuit board 310 by a solder 330 in a state in which the first and second external electrodes 131 and 132 are positioned to contact the first and second electrode pads 321 and 322, respectively.

Figure 13:
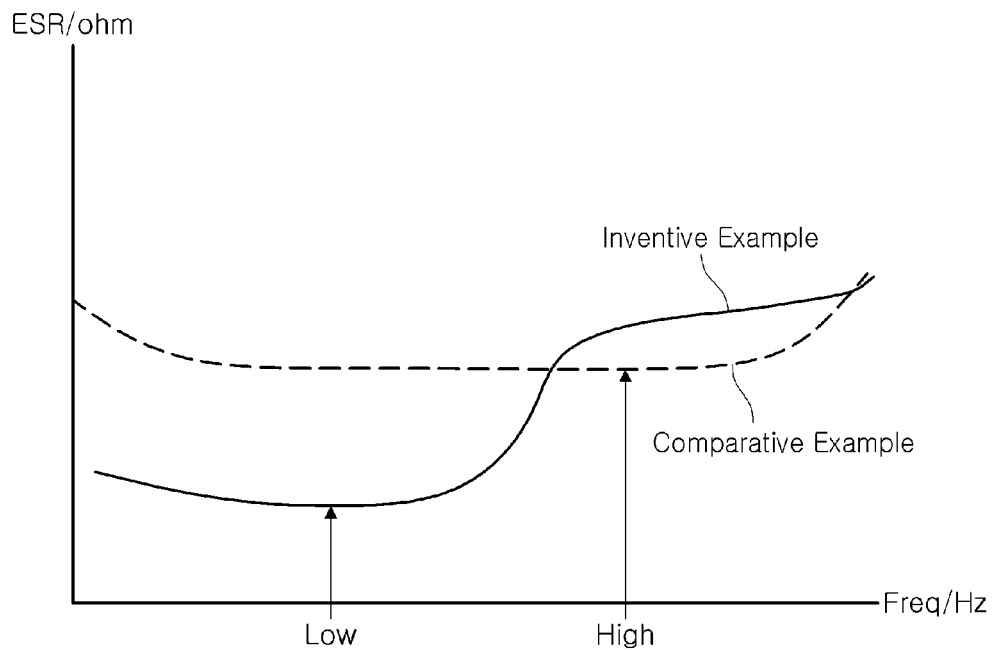
FIG. 13 is a graph showing a comparison between Inventive and Comparative Examples, in terms of equivalent serial resistance (ESR).

FIG. 13 is a graph showing a comparison between Inventive and Comparative Examples in terms of equivalent serial resistance (ESR).

Referring to FIG. 13, it may be appreciated that the ESR of a multilayer ceramic capacitor according to the Inventive Example is lower than that of a related art multilayer ceramic capacitor according to the Comparative Example in a low frequency band, and is higher than that of the related art multilayer ceramic capacitor in a high frequency band, the ringing phenomenon may be suppressed by the ESR increased in the high frequency band without consuming the switching current required for converting the power of the DC-DC converter.

As set forth above, according to embodiments of the invention, an inductor and a resistor connected in parallel are included to increase resistance components in a high frequency band, such that a multilayer ceramic capacitor for a DC-DC converter capable of suppressing resonance may be realized.

Therefore, in the multilayer ceramic capacitor according to the embodiment of the invention, resonance may be suppressed without affecting conversion efficiency as compared to the multilayer ceramic capacitor according to the related art, such that noise may be decreased.

In addition, in the multilayer ceramic capacitor according to the embodiment of the invention, the ESR thereof is decreased in a low frequency band and the ESR thereof is increased in a high frequency band, such that the ringing phenomenon may be suppressed by the ESR increased in the high frequency band without consuming switching current required for converting the power of the DC-DC converter.

Further, due to the above-described structure, the multilayer ceramic capacitor according to the embodiment of the invention may be small and be usable at high current, and thus a mounting space and costs thereof may be decreased.

While the present invention has been shown and described in connection with the embodiments, it will be apparent to those skilled in the art that modifications and variations can be made without departing from the spirit and scope of the invention as defined by the appended claims.

What is claimed is:

1. A multilayer ceramic capacitor comprising:
   a ceramic body including a plurality of dielectric layers and having first and second main surfaces facing each other, first and second side surfaces facing each other, and first and second end surfaces facing each other;
   a capacitor part formed in the ceramic body and including a first internal electrode having a lead exposed to the first side surface and a second internal electrode exposed to the second end surface;
   first to third internal connecting conductors formed in the ceramic body and having at least one polarity; and
   first to fourth external electrodes formed outwardly of the ceramic body and electrically connected to the first and second internal electrodes and the first to third internal connecting conductors,
   wherein the first and second internal connecting conductors and the third internal connecting conductor are connected in parallel, and
   the first to third internal connecting conductors and the capacitor part are connected in series.

2. The multilayer ceramic capacitor of claim 1, wherein the first and second external electrodes are disposed on the first and second end surfaces facing each other of the ceramic body, respectively, and
   the third and fourth external electrodes are disposed on the first and second side surfaces facing each other of the ceramic body, respectively.

3. The multilayer ceramic capacitor of claim 1, wherein the first and second internal connecting conductors contain a non-magnetic material.

4. The multilayer ceramic capacitor of claim 1, wherein the first internal connecting conductor is exposed to the first end surface and the second side surface.

5. The multilayer ceramic capacitor of claim 1, wherein the second internal connecting conductor is exposed to the first and second side surfaces.

6. The multilayer ceramic capacitor of claim 1, wherein the third internal connecting conductor is exposed to the first end surface and the first side surface.

7. The multilayer ceramic capacitor of claim 1, wherein an equivalent serial resistance (ESR) of the multilayer ceramic capacitor is controlled by the first to third internal connecting conductors.

8. The multilayer ceramic capacitor of claim 1, wherein an equivalent serial resistance (ESR) of the multilayer ceramic capacitor is increased in a high frequency band as compared to a low frequency band.

9. A board for mounting a multilayer ceramic capacitor, the board comprising:
 a printed circuit board having first and second electrode pads disposed thereon; and
 the multilayer ceramic capacitor of claim 1 mounted on the printed circuit board.

\* \* \* \* \*